(12) United States Patent
Zhao et al.

(10) Patent No.: US 8,059,374 B2
(45) Date of Patent: Nov. 15, 2011

(54) TMR DEVICE WITH NOVEL FREE LAYER STRUCTURE

(75) Inventors: Tong Zhao, Fremont, CA (US);
 Hui-Chuan Wang, Pleasanton, CA (US); Min Li, Dublin, CA (US);
 Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 494 days.

(21) Appl. No.: 12/319,972

(22) Filed: Jan. 14, 2009

(65) Prior Publication Data

US 2010/0177449 A1 Jul. 15, 2010

(51) Int. Cl.
 *G11B 5/33* (2006.01)
 *G11B 5/127* (2006.01)
 *H01L 29/82* (2006.01)
(52) U.S. Cl. ........... 360/324.2; 360/324.11; 360/324.12; 257/421; 257/E27.006
(58) Field of Classification Search ........... 360/324.2
 See application file for complete search history.

(56) References Cited

U.S. PATENT DOCUMENTS

| | | | |
|---|---|---|---|
| 6,784,509 B2 * | 8/2004 | Yuasa et al. | 257/421 |
| 6,841,395 B2 | 1/2005 | Linn et al. | |
| 6,982,932 B2 | 1/2006 | Sakakima et al. | |
| 7,130,167 B2 * | 10/2006 | Gill | 360/324.12 |
| 7,141,314 B2 * | 11/2006 | Zhang et al. | 428/811.2 |
| 7,333,306 B2 * | 2/2008 | Zhao et al. | 360/324.12 |
| 7,583,481 B2 * | 9/2009 | Zhang et al. | 360/324.11 |
| 7,800,868 B2 * | 9/2010 | Gao et al. | 360/324.12 |
| 7,916,433 B2 * | 3/2011 | Huai et al. | 360/324.12 |
| 2007/0047159 A1 | 3/2007 | Zhao et al. | |
| 2007/0111332 A1 | 5/2007 | Zhao et al. | |
| 2007/0139827 A1 | 6/2007 | Gao et al. | |
| 2007/0188942 A1 | 8/2007 | Beach et al. | |
| 2007/0242396 A1 | 10/2007 | Shimazawa et al. | |
| 2008/0061388 A1 | 3/2008 | Diao et al. | |
| 2008/0152834 A1 | 6/2008 | Pinarbasi | |
| 2009/0122450 A1 * | 5/2009 | Wang et al. | 360/324.2 |

OTHER PUBLICATIONS

Co-pending US Patent HT07-028, U.S. Appl. No. 11/983,718, filed Nov. 9, 2007, "Novel Free Layer Design for TMR/CPP Device," assigned to the same assignee as the present invention.
Co-pending US Patent HT07-040, U.S. Appl. No. 11/983,329, filed Nov. 8, 2007, "TMR Device with Low Magnetostriction Free Layer," assigned to the same assignee as the present invention.

(Continued)

*Primary Examiner* — Son Mai
(74) *Attorney, Agent, or Firm* — Saile Ackerman LLC; Stephen B. Ackerman

(57) ABSTRACT

A composite free layer having a FL1/insertion/FL2 configuration is disclosed for achieving high dR/R, low RA, and low $\lambda$ in TMR or GMR sensors. Ferromagnetic FL1 and FL2 layers have (+) $\lambda$ and (−) $\lambda$ values, respectively. FL1 may be CoFe, CoFeB, or alloys thereof with Ni, Ta, Mn, Ti, W, Zr, Hf, Tb, or Nb. FL2 may be CoFe, NiFe, or alloys thereof with Ni, Ta, Mn, Ti, W, Zr, Hf, Tb, Nb, or B. The thin insertion layer includes at least one magnetic element such as Co, Fe, and Ni, and at least one non-magnetic element selected from Ta, Ti, W, Zr, Hf, Nb, Mo, V, Cr, or B. In a TMR stack with a MgO tunnel barrier, dR/R>60%, $\lambda \sim 1 \times 10^{-6}$, and RA=1.2 ohm-um$^2$ when FL1 is CoFe/CoFeB/CoFe, FL2 is CoFe/NiFe/CoFe, and the insertion layer is CoTa or CoFeBTa.

20 Claims, 2 Drawing Sheets

OTHER PUBLICATIONS

"Giant tunneling magnetoresistance up to 410% at room temperature in fully epitaxial Co/MgO/Co magnetic tunnel junctions with bcc Co(001) electrodes," by Yuasa et al., Applied Physics Letters, vol. 89, 042505 (2006), pp. 1-3.

"Giant tunneling magnetoresistance effect in low-resistance CoFeB/MgO(001)/CoFeB magnetic tunnel junctions for read-head applications," by Tsunekawa et al., Applied Physics Letters, vol. 87, 072503 (2005), pp. 1-3.

"Giant tunnelling magnetoresistance at room temperature with MgO(100) tunnel barriers," by Parkin et al., 2004 Nature Publishing Group, nature materials, vol. 3, Dec. 2004, pp. 862-867, www.nature.com/naturematerials.

"230% room-temperature magnetoresistance in CoFeB/MgO/CoFeB magnetic tunnel junctions," by Djayaprawira et al., Applied Physics Letters, vol. 86, 082502 (2005), pp. 1-3.

"Ultralow resistance-area product of 0.4 ohms (um) squared and high magnetoresistance above 50% in CoFeB/MgO/CoFeB magnetic tunnel junctions," by Nagamine et al., Applied Physics Letters, vol. 89, 162507 (2006), pp. 1-3.

"Giang room-temperature magnetoresistance in single-crystal Fe/MgO/Fe magnetic tunnel junctions," by Yuasa et al., 2004 Nature Publishing Group, nature materials, vol. 3, Dec. 2004, pp. 868-871, www.nature.com/naturematerials.

* cited by examiner

TMR DEVICE WITH NOVEL FREE LAYER STRUCTURE

RELATED PATENT APPLICATIONS

This application is related to the following: Ser. No. 11/983,329, filing date Nov. 8, 2007; and Ser. No. 11/983,718; filing date Nov. 9, 2007; both assigned to a common assignee, and which are herein incorporated by reference in their entirety.

FIELD OF THE INVENTION

The invention relates to a high performance tunneling magnetoresistive (TMR) sensor in a read head and a method for making the same, and in particular, to a composite free layer in which a non-magnetic layer is inserted between two magnetic layers to achieve a high magnetoresistive (MR) ratio while enabling strong coupling between the magnetic layers.

BACKGROUND OF THE INVENTION

A TMR sensor otherwise known as a magnetic tunneling junction (MTJ) is a key component in magnetic devices such as Magnetic Random Access Memory (MRAM) and a magnetic recording head. A TMR sensor typically has a stack of layers with a configuration in which two ferromagnetic layers are separated by a thin non-magnetic insulator layer. The sensor stack in a so-called bottom spin valve configuration is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

A giant magnetoresistive (GMR) head is another type of memory device. In this design, the insulator layer between the pinned layer and free layer in the TMR stack is replaced by a non-magnetic conductive layer such as copper.

In the TMR stack, the pinned layer may have a synthetic anti-ferromagnetic (SyAF) configuration in which an outer pinned layer is magnetically coupled through a coupling layer to an inner pinned layer that contacts the tunnel barrier. The outer pinned layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 microns×0.1 microns at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) and low coercivity (Hc), a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$.

A MgO based MTJ is a very promising candidate for high frequency recording applications because its tunneling magnetoresistive (TMR) ratio is significantly higher than for AlOx or TiOx based MTJs as demonstrated by S. Yuasa et al. in "Giant room-temperature magnetoresistance in single crystal Fe/MgO/Fe magnetic tunnel junctions", Nature Materials, 3, 868-871 (2004), and in "Giant tunneling magnetoresistance up to 410% at room temperature in fully epitaxial Co/MgO/Co magnetic tunnel junctions with bcc Co(001) electrodes", Appl. Phys. Lett., 89, 042505 (2006), and by S. Parkin et al. in "Giant tunneling magnetoresistance at room temperature with MgO (100) tunnel barriers", Nature Materials, 3, 862-867 (2004).

CoFeB has been used in the free layer for MgO based MTJs to achieve high MR ratio and a soft magnetic layer. D. Djayaprawira et al. showed that MTJs with a CoFeB/MgO (001)/CoFeB structure made by conventional sputtering can also have a very high MR ratio of 230% with advantages of better flexibility and uniformity in "230% room temperature magnetoresistance in CoFeB/MgO/CoFeB magnetic tunnel junctions", Physics Letters 86, 092502 (2005).

For a low RA application, the MR ratio of CoFeB/Mg/MgO/CoFeB MTJs can reach 138% at RA=2.4 ohm/$\mu$m$^2$ according to K. Tsunekawa et al. in "Giant tunneling magnetoresistance effect in low resistance CoFeB/MgO(001)/CoFeB magnetic tunnel junctions for read head applications", Applied Physics Letters 87, 072503 (2005). In this case, a DC-sputtered Mg layer was inserted between the CoFeB pinned layer and an RF-sputtered MgO layer, an idea initially proposed by T. Linn et al. in U.S. Pat. No. 6,841,395 to prevent oxidation of the bottom electrode (CoFe) in a CoFe/MgO (reactive sputtering)/NiFe structure. Also, a Ta getter pre-sputtering prior to RF sputtering a MgO layer can achieve 55% TMR with 0.4 ohm/$\mu$m$^2$ as reported by Y. Nagamine et al. in "Ultralow resistance-area product of 0.4 ohm/$\mu$m$^2$ and high magnetoresistance above 50% in CoFeB/MgO/CoFeB magnetic junctions", Appl. Phys. Lett., 89, 162507 (2006).

In order to achieve a smaller Hc but still maintain a high TMR ratio, the industry tends to use CoFeB as the free layer in a TMR sensor. Unfortunately, the magnetostriction ($\lambda$) of a CoFeB free layer is considerably greater than the maximum acceptable value of about $5\times10^{-6}$ for high density memory applications. A free layer made of a CoFe/NiFe composite has been employed instead of CoFeB because of its low $\lambda$ and soft magnetic properties. However, when using a CoFe/NiFe free layer, the TMR ratio will degrade. Another approach is a composite free layer containing CoFeB with a positive $\lambda$ and a NiFe layer with a negative $\lambda$ to result in a low $\lambda$ and magnetic softness for the free layer. However, a CoFeB/NiFe type free layer structure is not usable because direct contact of CoFeB with NiFe will cause a drastic drop in the MR (TMR) ratio. Thus, an improved free layer in a TMR sensor is needed that provides low magnetostriction in combination with a high TMR ratio, low RA value, and low coercivity.

U.S. Pat. No. 7,333,306 and U.S. Patent Application 2007/0047159 show a tri-layered free layer represented by CoFe/CoFeB/NiFe to achieve low coercivity and low magnetostriction for either GMR-CPP or TMR sensors.

In U.S. Patent Application No. 2007/0139827, a free layer is described that includes a sense enhancing layer (Ta) sandwiched between a first ferromagnetic layer and a second ferromagnetic layer. The first ferromagnetic layer has a positive magnetostriction and is made of CoFeB or CoFe based alloys while the second ferromagnetic layer has a negative magnetostriction and is comprised of CoFe, Ni, or NiFe based alloys.

U.S. Patent Application No. 2007/0188942 discloses a free layer comprised three layers that include a lower NiFe or CoFe layer on the tunnel barrier layer, a Ta, Ru, Cu, or W spacer, and a CoFeB, CoFe, or NiFe upper layer.

In U.S. Patent Application 2007/0242396, a free layer is disclosed that comprises FeCo, a Heusler alloy, and NiFe.

U.S. Patent Application No. 2008/0061388 discloses a free layer with a CoFeB/Ru/CoFeTaB configuration.

U.S. Pat. No. 6,982,932 and U.S. Patent Application 2008/0152834 describe free layers that are laminations of NiFe, CoFe, and CoFeB.

SUMMARY OF THE INVENTION

One objective of the present invention is to provide a composite free layer that simultaneously achieves low magnetostriction, low RA with low coercivity, and a high magnetoresistive (MR) ratio in a sensor structure.

A second objective of the present invention is to provide a composite free layer according to the first objective that may be incorporated in a CIP-GMR, CPP-GMR, or TMR sensor.

A further objective is to provide a method of forming a composite free layer according to the first and second objectives that can be readily implemented in a manufacturing process and is cost effective.

According to one embodiment of the present invention, these objectives are achieved by forming a TMR sensor on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The tunnel barrier layer is preferably made of MgO, and the free layer has a composite structure represented by FL1/INS/FL2 where FL1 and FL2 are magnetic layers that may be comprised of more than one material and INS is an insertion layer which is preferably an alloy comprised of at least one magnetic element including Co, Fe, and Ni and at least one non-magnetic element such as Ta, Ti, W, Zr, Hf, Nb, Mo, V, and Cr. B may be employed as a non-magnetic element in a quaternary alloy. The MR ratio and coupling strength between the FL1 and FL2 layers is modified by adjusting the thickness and non-magnetic content in the insertion layer. Strong magnetic coupling between FL1 and FL2 is necessary for high performance and good device stability.

In a second embodiment, the composite free layer described previously is formed in a GMR sensor that has a bottom spin valve structure comprised of a seed layer, AFM layer, pinned layer, non-magnetic spacer, free layer, and capping layer. The GMR sensor may have a CIP or CPP configuration.

Typically, the stack of layers in the TMR or GMR sensor is laid down in a sputtering system. All of the layers may be deposited in the same sputter chamber. In the TMR embodiment, the MgO tunnel barrier is preferably formed by depositing a first Mg layer on the pinned layer followed by a natural oxidation process on the first Mg layer to form a MgO layer and then depositing a second Mg layer on the MgO layer. The oxidation step is performed in an oxidation chamber within the sputtering system. One or more annealing steps may be employed to set the magnetization direction of the AFM and pinned layers. The TMR stack is patterned by a conventional method prior to forming a top shield on the capping layer.

DETAILED DESCRIPTION OF THE INVENTION

The present invention is a high performance magnetoresistive sensor having a composite free layer containing an insertion layer comprised of at least one magnetic element and at least one non-magnetic element and a method for making the same. While the exemplary embodiment depicts a TMR sensor in a read head, the present invention may be employed in other devices based on a magnetoresistive element such as a GMR-CPP or GMR-CIP sensor. The TMR or GMR sensor may have a bottom spin valve, top spin valve, or multilayer spin value configuration as appreciated by those skilled in the art. Magnetoresistive (MR) ratio may be used interchangeably with TMR ratio when referring to TMR sensors.

Figure 1:
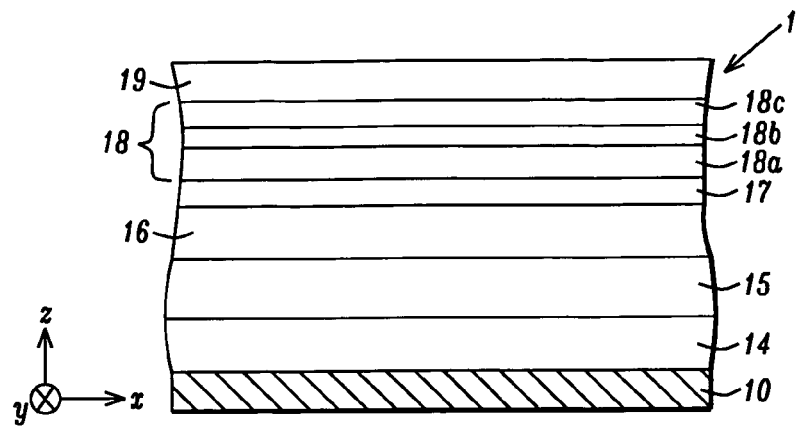
FIG. 1 is a cross-sectional view showing a TMR stack of layers with a composite free layer according to one embodiment of the present invention.

Referring to FIG. 1, a portion of a partially formed TMR sensor 1 of the present invention is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). Typically, a first gap layer (not shown) is formed on the bottom shield. It should be understood that the substructure may be comprised of a wafer made of AlTiC, for example.

A TMR stack is formed on the substrate 10 and in the exemplary embodiment has a bottom spin valve configuration wherein a seed layer 14, AFM layer 15, pinned layer 16, tunnel barrier layer 17, composite free layer 18, and capping layer 19 are sequentially formed on the substrate. The seed layer 14 may have a thickness of 10 to 100 Angstroms and is preferably a Ta/Ru composite but Ta, Ta/NiCr, Ta/Cu, Ta/Cr or other seed layer configurations may be employed, instead. The seed layer 14 serves to promote a smooth and uniform grain structure in overlying layers. Above the seed layer 14 is an AFM layer 15 used to pin the magnetization direction of the overlying pinned layer 16, and in particular, the outer portion or AP2 layer (not shown). The AFM layer 15 has a thickness from 40 to 300 Angstroms and is preferably comprised of IrMn with a thickness between 40 and 70 Angstroms. Optionally, one of PtMn, NiMn, OsMn, RuMn, RhMn, PdMn, RuRhMn, or MnPtPd may be selected as the AFM layer.

The pinned layer 16 preferably has a synthetic anti-parallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer is formed on the AFM layer 15 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 16 along the easy axis direction of the TMR sensor to be patterned in a later step. Exchange coupling between the AP2 layer and the AP1 layer is facilitated by a coupling layer that is preferably comprised of Ru with a thickness from 3 to 9 Angstroms. The AP1 layer is also referred to as the inner pinned layer and may be a single layer or a composite layer. In one aspect, the AP1 layer is amorphous in order to provide a more uniform surface on which to form the tunnel barrier layer 17.

In the exemplary embodiment that features a bottom spin valve configuration, the tunnel barrier layer 17 is comprised of MgO because a MgO tunnel barrier is known to provide a higher TMR ratio than a TMR stack made with an AlOx or TiOx tunnel barrier. The MgO tunnel barrier layer is preferably formed by depositing a first Mg layer having a thickness between 4 and 14 Angstroms on the pinned layer 16, oxidizing the Mg layer with a natural oxidation (NOX) process, and then depositing a second Mg layer with a thickness of 2 to 8 Angstroms on the oxidized first Mg layer. The tunnel barrier is believed to have a MgO/Mg configuration immediately following deposition of the second Mg layer. The second Mg layer serves to protect the subsequently deposited free layer from oxidation. However, during an annealing step following deposition of the entire TMR stack of layers, oxygen may diffuse from the lower MgO layer into the upper Mg layer. Therefore, the final tunnel barrier layer composition is generally considered to be MgO. Note that the RA and MR ratio for the TMR sensor may be adjusted by varying the thickness of the two Mg layers in tunnel barrier layer 17 and by varying the natural oxidation time and pressure. A thicker MgO layer resulting from longer oxidation time and/or higher pressure would increase the RA value.

All layers in the TMR stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The NOX process may be performed in an oxidation chamber within the sputter deposition system by applying an oxygen pressure of 0.1 mTorr to 1 Torr for about 15 to 300 seconds. In the exemplary embodiment, no heating or cooling is applied to the oxidation chamber during the NOX process. Oxygen pressure between $10^{-6}$ and 1 Torr is preferred for an oxidation time mentioned above in order to achieve a RA in the range of 0.5 to 5 ohm-um$^2$. A mixture of $O_2$ with other inert gases such as Ar, Kr, or Xe may also be used for better control of the oxidation process.

The present invention anticipates that a MgO barrier layer 17 could be formed by depositing a MgO layer on a pinned layer with a rf-sputtering or reactive sputtering method. It should be understood that the performance of a TMR sensor fabricated with a barrier layer comprised of sputtered MgO will not be as desirable as one made according to the preferred embodiment of this invention. For example, the inventors have observed that the final RA uniformity (1σ) of 0.6 um circular devices is more than 10% when the MgO tunnel barrier layer is rf-sputtered and less than 3% when the MgO tunnel barrier is formed by DC sputtering a Mg layer followed by a NOX process.

Optionally, other materials such as TiOx, AlTiO, MgZnO, $Al_2O_3$, ZnO, ZrOx, or HfOx, or any combination of the aforementioned materials including MgO may be used as the tunnel barrier layer 17.

Previously, we disclosed composite free layer structures that result in TMR or GMR sensors having high TMR ratio, low Hc with low λ, and a low RA value. For example, in related patent application Ser. No. 11/983,718, we described a CoFeB/non-magnetic/NiFe trilayer configuration for a free layer where the non-magnetic layer is made of Hf, V, Zr, Nb, Ta, Mo, or Cr. High TMR ratio is achieved because CoFeB and NiFe layers are separated by a Ta insertion layer, for example. CoFeB and NiFe are magnetically coupled through orange-peel type coupling which tends to align the magnetic moments in parallel configuration. However, this coupling is relatively weak and in a real device has to compete with magnetostatic coupling from the edge of the two ferromagnetic free layers which tends to align the magnetic moments of the CoFeB and NiFe layers anti-parallel. Moreover, stress induced anisotropy tends to align the moments for CoFeB and NiFe perpendicular to one another because of the opposite signs of magnetostriction. As a result, magnetic noise for this free layer structure is rather high. Although signal amplitude is high, improvement in signal to noise ratio (SNR) is limited and a further enhancement in SNR is desirable.

In related patent application Ser. No. 11/983,329, we demonstrated that a free layer with a trilayer configuration comprised of at least one CoFe layer having a (+) λ value and at least one negative λ layer such as CoB or FeB can yield a high performance sensor. However, we were motivated to further modify the composite free layer to enable greater flexibility in adjusting the magnetic properties therein. We have discovered that by modifying the middle layer in a trilayer configuration represented by FL1/INS/FL2 such that the insertion (INS) layer includes at least one magnetic element and at least one non-magnetic element, both the thickness and non-magnetic content of the insertion layer may be used to adjust the TMR ratio, λ, and coupling strength between the ferromagnetic FL1 and FL2 layers.

Returning to FIG. 1, an important feature of the present invention is the composite free layer 18 formed on the tunnel barrier layer 17. In one embodiment, the free layer 18 has a composition represented by FL1/INS/FL2 where FL1 and FL2 are ferromagnetic layers 18a, 18c, respectively, and INS is an insertion layer 18b which is an alloy made of at least one magnetic element and at least one non-magnetic element. The at least one magnetic element is selected from Fe, Co, and Ni, and the at least one non-magnetic element is selected from Ta, Ti, W, Zr, Hf, Nb, Mo, V, Mg, and Cr. B may be employed as a non-magnetic element in an insertion layer comprised of a quaternary alloy. Insertion layer 18b preferably has an overall non-magnetic character with a thickness from 2 to 10 Angstroms. By keeping the insertion layer 18b thickness constant and increasing the magnetic element content, the coupling strength between the FL1 and FL2 layers is increased but TMR ratio is decreased. Lowering the magnetic element content in the insertion layer 18b will have the opposite effect. A strong coupling (Hcp) between the FL1 layer 18a and FL2 layer 18c is desirable in order to minimize noise in the sensor and improve the signal to noise (SNR) ratio. Moreover, magnetic stability improves as the Hcp value increases.

Preferably, the FL1 layer 18a is ferromagnetic and has a composition represented by $Co_wFe_{(100-w)}$ or $[Co_wFe_{(100-w)}]_{(100-y)}B_Y$ where w is from 0 to about 100% and y is from 10 atomic % to about 40 atomic %, or the FL1 layer may be an alloy of one of the aforementioned compositions comprised of one or more additional elements such as Ni, Ta, Mn, Ti, W, Zr, Hf, Tb, Mg, and Nb. The FL1 layer 18a may be a single layer or a composite with multiple layers having a thickness from 2 to 40 Angstroms and is relied upon to provide a high dR/R ratio. For example, when one of CoFeB, CoFe/CoFeB, or CoFe/CoFeB/CoFe is selected as FL1 layer 18a, the dR/R (TMR ratio) is advantageously increased. When FL1 layer 18a is a composite of two or more layers including CoFeB, the thickness of the CoFeB layer is preferably greater than the other layer or layers in the composite in order to maximize dR/R. Note that a CoFeB layer generally has a large (+) λ value which must be offset by a (−) λ value in one or more other layers in the free layer 18 in order to achieve a magnetostriction less than about $5×10^{-6}$ for high performance.

The FL2 layer 18c is also ferromagnetic and may be a single layer or a composite having two or more layers and a thickness from 2 to 50 Angstroms. In one aspect, the FL2 layer 18c is comprised of a $Co_wFe_{(100-w)}$ layer where w is from 0 to about 100 atomic %, a $Ni_zFe_{(100-z)}$ layer where z is from about 70% to 100%, or a combination of the aforementioned layers. Furthermore, the embodiment encompasses a FL2 layer 18c that is an alloy wherein CoFe or NiFe are combined with one or more elements selected from Ni, Ta, Mn, Ti, W, Zr, Hf, Tb, Nb, or B. For example, the FL2 layer 18c may have a CoFe, NiFe, or CoFe/NiFe/CoFe composition. In an embodiment wherein CoFe/NiFe/CoFe is selected as the FL2 layer 18c, the NiFe layer is preferably substantially thicker than the CoFe layers in order to take advantage of the soft magnetic character of NiFe and the (−) λ contribution from a NiFe material to offset the (+) λ value in FL1 layer 18a. In a FL2 layer 18c, a NiFe layer may be sandwiched between two CoFe layers to avoid the NiFe layer contacting an insertion layer containing Ta since adjoining Ta and NiFe layers are known to form a so called "dead zone" that degrades dR/R. In general, FL2 materials or composite structures having a (−) λ value and that promote strong coupling through the insertion layer 18b with the FL1 layer 18a are preferred. However, FL2 layer 18c may have a small (+) λ value when used in combination with a FL1 layer 18a having a small (+) λ value.

With regard to insertion layer 18b, it should be understood that an alloy of a magnetic element and a non-magnetic element may be formed by co-sputtering a target of each element in a sputter deposition chamber. When multiple elements are involved as in a CoFeBTa alloy, for example, a CoFeB target may be co-sputtered with a Ta target to achieve the desired composition in the resulting CoFeBTa insertion layer. In a preferred embodiment, the ratio of CoFeB:Ta in the CoFeBTa alloy is about 2:1 to give an overall non-magnetic character for the insertion layer 18b. However, the CoFeB:Ta ratio may vary from about 1:1 to 4:1 and still retain the advantages provided by the composite free layer 18 of the present invention. In general, a CoFeB composition in the CoFeBTa alloy is preferred where Co is from about 40 to 70 atomic %, Fe is from 20 to 40 atomic %, and B is from 10 to 30 atomic %. In another preferred embodiment, CoTa is selected as the insertion layer 18b and has a Co:Ta ratio of about 2:1. Optionally, the Co content may be varied between 50 and 80 atomic % to afford a Co:Ta ratio between 1:1 and 4:1 and an overall non-magnetic character. As stated previously, increasing the content of the magnetic element which is Co in this example will increase the coupling strength between the FL1 and FL2 layers but will lower the TMR ratio. Decreasing the Co content to near 50 atomic % will lower the coupling strength but will increase the TMR ratio.

In one embodiment, the capping layer 19 formed on FL2 layer 18c may be comprised of Ru, Ta, or a combination of Ru and Ta. Optionally, the capping layer 19 may be made of other materials used in the art.

Once the TMR stack is complete, the partially formed read head 1 may be annealed in a vacuum oven within the range of 240° C. to 340° C. with an applied magnetic field of at least 2000 Oe, and preferably 8000 Oe for about 2 to 10 hours to set the pinned layer and free layer magnetization directions. It should be understood that under certain conditions, depending upon the time and temperature involved in the anneal process, the tunnel barrier layer 17 may become a uniform MgO tunnel barrier layer as unreacted oxygen in the lower MgO layer diffuses into the adjacent Mg layer in the MgO/Mg stack.

Figure 2:
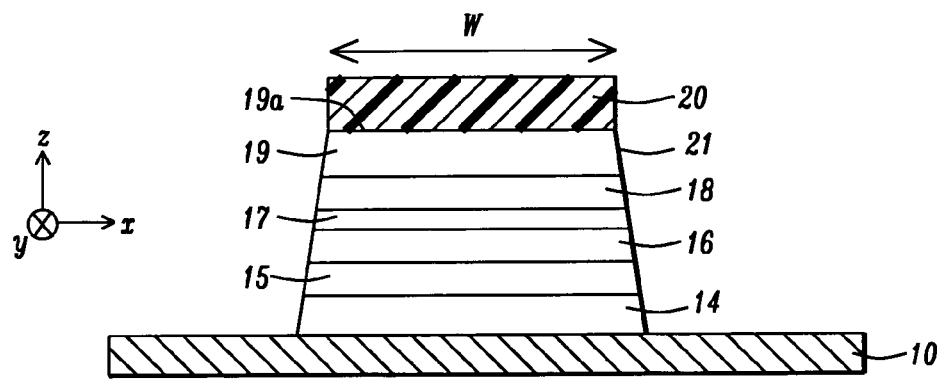
FIG. 2 is a cross-sectional view showing a TMR stack of layers that has been patterned to form a MTJ element during an intermediate step of fabricating the TMR sensor according to one embodiment of the present invention.

Referring to FIG. 2, the TMR stack is patterned by following a conventional process sequence. For example, a photoresist layer 20 may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process may stop on the first gap layer above the bottom shield 10 or between the bottom shield and a barrier layer (not shown) to give a TMR sensor with a top surface 19a and sidewalls 21.

Figure 3:
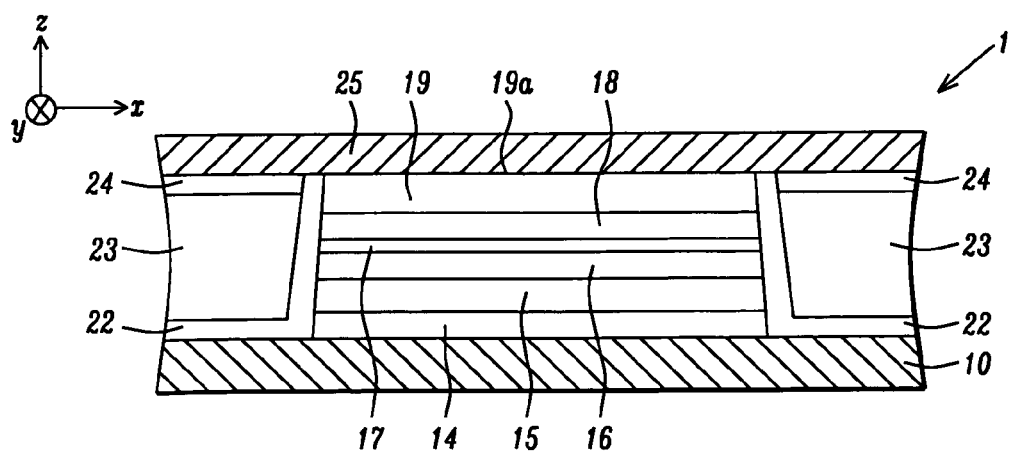
FIG. 3 is a cross-sectional view of a TMR read head having a MTJ element interposed between a top shield and bottom shield and formed according to an embodiment of the present invention.

Referring to FIG. 3, an insulating layer 22 may be deposited along the sidewalls 21 of the TMR sensor. The photoresist layer 20 is then removed by a lift off process. A top lead otherwise known as a top shield 25 is then deposited on the insulating layer 22 and top surface 19a of the TMR sensor. Similar to the bottom shield 10, the top shield 25 may also be a NiFe layer about 2 microns thick. The TMR read head 1 may be further comprised of a second gap layer (not shown) disposed on the top shield 25.

Figure 4:
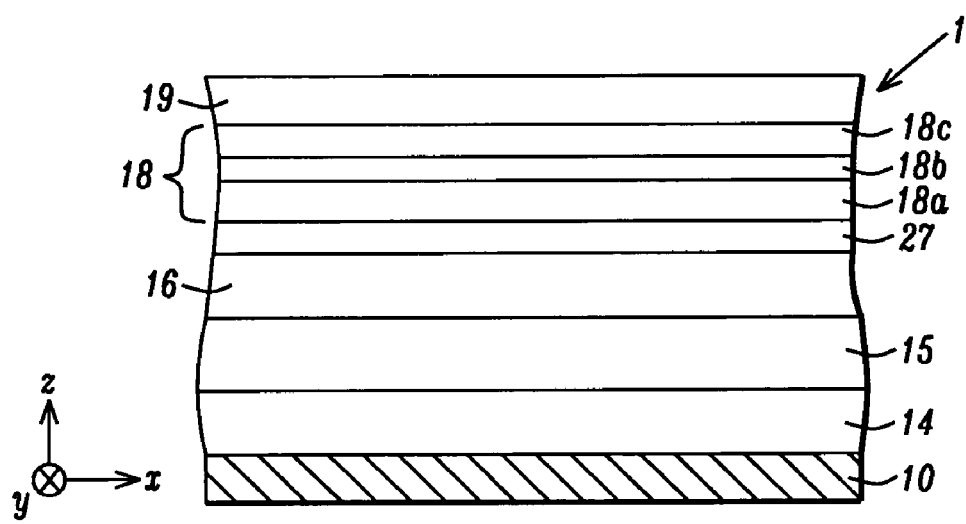
FIG. 4 is a cross-sectional view of a GMR read head having a composite free layer according to a second embodiment of the present invention.

In a second embodiment represented by FIG. 4 that relates to a GMR-CPP or GMR-CIP device, the magnetoresistive element 1 is a stack of layers which is the same as described previously except the tunnel barrier layer 17 is replaced by a non-magnetic spacer layer 27 that may be Cu, for example. The FL1 layer 18a contacts a top surface of the non-magnetic spacer 27. The magnetoresistive element 1 may be patterned by the same sequence of steps described previously with respect to FIG. 2.

Comparative Example 1

An experiment was conducted to demonstrate the improved performance achieved by implementing a free layer in a TMR sensor according to the present invention. Two TMR stacks hereafter referred to as MTJ Sample A and Sample B and shown in Table 1 were fabricated as reference MTJs. Samples A and B have a TMR structure similar to that of the present invention except the insertion layer in the composite free layer has only a non-magnetic element and does not include a magnetic element. All TMR stacks in Table 1 have a composition represented by Ta/Ru/IrMn/CoFe/Ru/CoFe/MgO/free layer/capping layer. Ta/Ru is a composite seed layer wherein both Ta and Ru layers have a 20 Angstrom thickness. The AFM layer is IrMn and has a 70 Angstrom thickness. The pinned layer has an AP2/Ru/AP1 structure in which the AP2 layer is a 25 Angstrom thick $Co_{70}Fe_{30}$ layer, the Ru coupling layer has a 7.5 Angstrom thickness, and the AP1 layer is a 25 Angstrom thick $CO_{70}Fe_{30}$ layer. The MgO tunnel barrier was formed by depositing a 7 Angstrom thick lower Mg layer that was subjected to a NOX process before a 3 Angstrom thick upper Mg layer was deposited. The capping layer in this example is Ru/Ta wherein the lower Ru layer is 10 Angstroms thick and the upper Ta layer is 60 Angstroms thick. The free layer has a FL1/insertion layer/FL2 configuration in which FL1 is $Co_{90}Fe_{10}3/CO_{60}Fe_{20}B_{20}20/CO_{90}Fe_{10}3$ and FL2 is $Co_{90}Fe_{10}3/Ni_{90}Fe_{10}40/Co_{90}Fe_{10}3$ where the numbers following CoFe, NiFe, and CoFeB indicate the thickness of that particular layer. Samples C and D have an insertion layer according to the present invention wherein at least one magnetic element and at least one non-magnetic element is included. The TMR stack was formed on a NiFe shield and was annealed under vacuum at 280° C. for 5 hours with an applied field of 8000 Oe.

TABLE 1

Magnetic properties of TMR sensors with Ta/Ru/IrMn/CoFe/Ru/CoFe/MgO/free/cap configuration where free layer is CoFe3/CoFeB20/CoFe3/INS/CoFe3/NiFe40/CoFe2

| MTJ Sample | Insertion Layer (INS) Composition | RA | dR/R | Hcp (Oe) |
|---|---|---|---|---|
| A | Ta (1 Angstrom) | 1.2 | 57% | 860 |
| B | Ta (3 Angstroms) | 1.2 | 60% | 100 |
| C | CoFeBTa or CoTa (6 Angstroms) | 1.2 | 63% | 780 |
| D | CoFeBTa or CoTa (4 Angstroms) | 1.2 | 61% | 960 |

As we previously disclosed in related patent application Ser. No. 11/983,718, a Ta insertion layer between two ferromagnetic layers in a composite free layer can improve the magnetoresistive (TMR) ratio. Increasing the Ta thickness from 1 Angstrom in Sample A to 3 Angstroms in Sample B provides a dR/R gain from 57% to 60% because thicker Ta is preferred for blocking the impact of a NiFe layer contacting a CoFeB layer. However, the coupling field between the two ferromagnetic layers (Hcp) decreases rapidly with increasing Ta thickness which is undesirable because of a negative influence on device stability.

Samples C and D in Table 1 demonstrate that a high coupling field can be realized simultaneously with high dR/R and low RA when an insertion layer according to the present invention is inserted between the CoFe/CoFeB/CoFe and CoFe/NiFe/CoFe layers. For example, by selecting a 6 Angstrom thick film of CoFeBTa or CoTa as the insertion layer (Sample C), there is a significant gain in dR/R to 63% while Hcp remains high at 780 Oe. The CoFeB:Ta or Co:Ta composition ratio is about 2:1 and the single layer of CoFeBTa or CoTa is non-magnetic at this composition. As stated earlier, by decreasing the insertion layer thickness (Sample D), dR/R decreases but Hcp increases. On the other hand, increasing the insertion layer thickness above 6A (not shown) would increase dR/R but lower the Hcp value. Further optimization of dR/R and Hcp is possible by adjusting the magnetic:non-magnetic element ratio in the insertion layer. Moreover, λ for the composite free layer may be adjusted by varying the composition or thickness of the NiFe layer with minimal effect on dR/R.

All samples listed in Table 1 have reasonably good magnetic softness with a coercivity (Hc) around 4 to 5 Oe and λ of about $1 \times 10^{-6}$. Magnetic properties were obtained from 0.8 micron circular devices. It should be understood that the dR/R values will increase as the sensor size decreases.

The advantages of the present invention are that a high TMR ratio of greater than 60% can be achieved simultaneously with a low RA value (<2 ohm-um$^2$) and low magnetostriction which is a significant improvement over conventional TMR sensors (MTJs) based on a FeCo/NiFe free layer (low dR/R ratio), or based on a FeCo/CoFeB free layer (high magnetostriction). Furthermore, soft magnetic properties (low Hc) are realized with a composite FL1/INS/FL2 free layer composition as disclosed herein.

The free layers disclosed in the embodiments found herein may be fabricated without additional cost since no new sputtering targets or sputter chambers are required. Furthermore, a low temperature anneal process may be employed which is compatible with the processes for making GMR sensors. Therefore, there is no change in process flow and related processes compared with current manufacturing schemes.

While this invention has been particularly shown and described with reference to, the preferred embodiment thereof, it will be understood by those skilled in the art that various changes in form and details may be made without departing from the spirit and scope of this invention.

We claim:

1. A magnetoresistive element in a magnetic device, comprising:
    (a) a stack of layers comprised of a seed layer, anti-ferromagnetic (AFM) layer, and a pinned layer sequentially formed on a substrate;
    (b) a tunnel barrier layer with a top surface formed on the pinned layer;
    (c) a composite free layer contacting the top surface of the tunnel barrier layer; said composite free layer is comprised of:
        (1) a first ferromagnetic layer comprised of one or more of $Co_wFe_{(100-w)}$, $[Co_wFe_{(100-w)}]_{(100-y)}B_y$ where w is from 0 to about 100% and y is from 10 atomic % to about 40 atomic %, and an alloy of one of the aforementioned compositions comprised of one or more additional elements including Ni, Ta, Mn, Ti, W, Zr, Hf, Tb, and Nb, said first ferromagnetic layer has a positive magnetostriction and contacts the top surface of the tunnel barrier layer;
        (2) an insertion layer formed on the first ferromagnetic layer and including at least one magnetic element selected from Fe, Co, and Ni and at least one non-magnetic element selected from Ta, Ti, W, Zr, Hf, Nb, Mo, V, Mg, or Cr; and
        (3) a second ferromagnetic layer comprised of one or more of $Co_wFe_{(100-w)}$ where w is from 0 to about 100 atomic %, $Ni_zFe_{(100-z)}$ where z is from about 70% to 100%, and an alloy wherein CoFe or NiFe are combined with one or more elements selected from Ni, Ta, Mn, Ti, W, Zr, Hf, Tb, Nb, and B, said second ferromagnetic layer has a negative magnetostriction and is formed on the insertion layer; and
    (d) a capping layer formed on the second ferromagnetic layer in the composite free layer.

2. The magnetoresistive element of claim 1 wherein the first ferromagnetic layer has a thickness from about 2 to 40 Angstroms and is CoFeB, CoFe/CoFeB, or CoFe/CoFeB/CoFe.

3. The magnetoresistive element of claim 1 wherein the insertion layer has a thickness from about 2 to 10 Angstroms and has a CoTa composition wherein the ratio of Co to Ta is from about 1:1 to 4:1.

4. The magnetoresistive element of claim 1 wherein the insertion layer has a thickness from about 2 to 10 Angstroms and has a CoFeBTa composition wherein the ratio of CoFeB to Ta is from about 1:1 to 4:1.

5. The magnetoresistive element of claim 1 wherein the second ferromagnetic layer has a thickness from about 2 to 50 Angstroms and is CoFe, NiFe, or CoFe/NiFe/CoFe.

6. The magnetoresistive element of claim 1 wherein the tunnel barrier layer is comprised of one or more of MgO, MgZnO, ZnO, $Al_2O_3$, TiOx, AlTiO, HfOx and ZrOx.

7. A magnetoresistive element in a magnetic device, comprising:
(a) a stack of layers comprised of a seed layer, anti-ferromagnetic (AFM) layer, and a pinned layer sequentially formed on a substrate;
(b) a non-magnetic spacer layer with a top surface formed on the pinned layer;
(c) a composite free layer contacting the top surface of the non-magnetic spacer layer; said composite free layer is comprised of:
  (1) a first ferromagnetic layer comprised of one or more of $Co_WFe_{(100-W)}$, $[Co_WFe_{(100-W)}]_{(100-y)}B_Y$ where w is from 0 to about 100% and y is from 10 atomic % to about 40 atomic %, and an alloy of one of the aforementioned compositions comprised of one or more additional elements including Ni, Ta, Mn, Ti, W, Zr, Hf, Tb, and Nb, said first ferromagnetic layer has a positive magnetostriction and contacts the top surface of the non-magnetic spacer layer;
  (2) an insertion layer formed on the first ferromagnetic layer and including at least one magnetic element selected from Fe, Co, and Ni and at least one non-magnetic element selected from Ta, Ti, W, Zr, Hf, Nb, Mo, V, Mg, and Cr; and
  (3) a second ferromagnetic layer comprised of one or more of $Co_WFe_{(100-W)}$ where w is from 0 to about 100 atomic %, $Ni_ZFe_{(100-Z)}$ where z is from 0 to 100%, and an alloy wherein CoFe or NiFe are combined with one or more elements selected from Ni, Ta, Mn, Ti, W, Zr, Hf, Tb, Nb, and B, said second ferromagnetic layer has a negative magnetostriction and is formed on the insertion layer; and
(d) a capping layer formed on the second ferromagnetic layer in the composite free layer.

8. The magnetoresistive element of claim 7 wherein the magnetic device is a GMR-CPP sensor or a GMR-CIP sensor.

9. The magnetoresistive element of claim 7 wherein the first ferromagnetic layer has a thickness from about 2 to 40 Angstroms and is CoFeB, CoFe/CoFeB, or CoFe/CoFeB/CoFe.

10. The magnetoresistive element of claim 7 wherein the insertion layer has a thickness from about 2 to 10 Angstroms and has a CoTa composition wherein the ratio of Co to Ta is about 1:1 to 4:1.

11. The magnetoresistive element of claim 7 wherein the insertion layer has a thickness from about 2 to 10 Angstroms and has a CoFeBTa composition wherein the ratio of CoFeB to Ta is about 1:1 to 4:1.

12. The magnetoresistive element of claim 7 wherein the second ferromagnetic layer has a thickness from about 2 to 50 Angstroms and is CoFe, NiFe, or CoFe/NiFe/CoFe.

13. A method of forming a magnetoresistive element in a TMR sensor, comprising:
(a) sequentially forming a seed layer, AFM layer, and a pinned layer on a substrate;
(b) forming a tunnel barrier layer with a top surface on said pinned layer;
(c) forming a composite free layer on the tunnel barrier layer, said composite free layer is comprised of:
  (1) a first ferromagnetic layer comprised of one or more of $Co_WFe_{(100-W)}$, $[Co_WFe_{(100-W)}]_{(100-y)}B_Y$ where w is from 0 to about 100% and y is from 10 atomic % to about 40 atomic %, and an alloy of one of the aforementioned compositions comprised of one or more additional elements including Ni, Ta, Mn, Ti, W, Zr, Hf, Tb, and Nb, said first ferromagnetic layer has a positive magnetostriction and contacts the top surface of the tunnel barrier layer;
  (2) an insertion layer formed on the first ferromagnetic layer and including at least one magnetic element selected from Fe, Co, and Ni and at least one non-magnetic element selected from Ta, Ti, W, Zr, Hf, Nb, Mo, V, Mg, and Cr; and
  (3) a second ferromagnetic layer comprised of one or more of $Co_WFe_{(100-W)}$ where w is from 0 to about 100 atomic %, $Ni_ZFe_{(100-Z)}$ where z is from about 70% to 100%, and an alloy wherein CoFe or NiFe are combined with one or more elements selected from Ni, Ta, Mn, Ti, W, Zr, Hf, Tb, Nb, and B, said second ferromagnetic layer has a negative magnetostriction and is formed on the insertion layer; and
(d) forming a capping layer on the composite free layer.

14. The method of claim 13 wherein the tunnel barrier layer is comprised of one or more of MgO, MgZnO, ZnO, $Al_2O_3$, TiOx, AlTiO, HfOx and ZrOx.

15. The method of claim 14 wherein formation of the MgO tunnel barrier layer is comprised of depositing a first Mg layer, performing a natural oxidation process to form a MgO layer, and then depositing a second Mg layer on the MgO layer.

16. The method of claim 15 further comprised of annealing a stack of layers comprised of the tunnel barrier layer and composite free layer.

17. The method of claim 13 wherein the first ferromagnetic layer has a thickness from about 2 to 40 Angstroms and is CoFeB, CoFe/CoFeB, or CoFe/CoFeB/CoFe.

18. The method of claim 13 wherein the insertion layer has a thickness from about 2 to 10 Angstroms and has a CoTa composition wherein the ratio of Co to Ta is from about 1:1 to 4:1.

19. The method of claim 13 wherein the insertion layer has a thickness from about 2 to 10 Angstroms and has a CoFeBTa composition wherein the ratio of CoFeB to Ta is from about 1:1 to 4:1.

20. The method of claim 13 wherein the second ferromagnetic layer has a thickness from about 2 to 50 Angstroms and is CoFe, NiFe, or CoFe/NiFe/CoFe.

* * * * *